(12) United States Patent
Zeng et al.

(10) Patent No.: US 11,694,904 B2
(45) Date of Patent: Jul. 4, 2023

(54) SUBSTRATE STRUCTURE, AND FABRICATION AND PACKAGING METHODS THEREOF

(71) Applicant: Yangtze Memory Technologies Co., Ltd., Wuhan (CN)

(72) Inventors: Xinru Zeng, Wuhan (CN); Peng Chen, Wuhan (CN); Houde Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 34 days.

(21) Appl. No.: 17/202,498

(22) Filed: Mar. 16, 2021

(65) Prior Publication Data
US 2022/0238351 A1    Jul. 28, 2022

Related U.S. Application Data

(63) Continuation of application No. PCT/CN2021/073708, filed on Jan. 26, 2021.

(51) Int. Cl.
    *H01L 21/48*    (2006.01)
    *H01L 23/498*    (2006.01)
    (Continued)

(52) U.S. Cl.
    CPC .......... *H01L 21/486* (2013.01); *H01L 21/481* (2013.01); *H01L 21/4853* (2013.01);
    (Continued)

(58) Field of Classification Search
    CPC .. H01L 21/486; H01L 21/481; H01L 21/4853
    See application file for complete search history.

(56) References Cited

U.S. PATENT DOCUMENTS

| 2011/0018144 A1* | 1/2011 | Horiuchi | H05K 3/4605 |
| | | | 257/784 |
| 2011/0089563 A1 | 4/2011 | Kikuchi et al. | |
| | | (Continued) | |

FOREIGN PATENT DOCUMENTS

| CN | 101246877 A | 8/2008 |
| CN | 103165566 A | 6/2013 |
| | (Continued) | |

OTHER PUBLICATIONS

The World Intellectual Property Organization (WIPO) International Search Report for PCT/CN2021/073708 dated Sep. 23, 2021 4 pages.

*Primary Examiner* — Errol V Fernandes
(74) *Attorney, Agent, or Firm* — Anova Law Group, PLLC

(57) ABSTRACT

A method for fabricating a substrate structure for packaging includes providing a core substrate, a plurality of conductive pads at a first surface of the core substrate, and a metal layer at a second surface of the core substrate opposite to the first surface; forming a conductive structure, for pasting the substrate structure onto an external component, on each of the plurality of conductive pads; forming a molding compound on the first surface of the core substrate and to encapsulate the conductive structure; and forming a plurality of packaging pads by patterning the metal layer at the second surface of the core substrate.

18 Claims, 9 Drawing Sheets

(51) Int. Cl.
  *H01L 25/065* (2023.01)
  *H01L 25/00* (2006.01)
  *H01L 23/00* (2006.01)

(52) U.S. Cl.
  CPC .... *H01L 23/49827* (2013.01); *H01L 25/0657* (2013.01); *H01L 25/50* (2013.01); *H01L 24/32* (2013.01); *H01L 24/48* (2013.01); *H01L 24/73* (2013.01); *H01L 2224/32145* (2013.01); *H01L 2224/32225* (2013.01); *H01L 2224/48227* (2013.01); *H01L 2224/73215* (2013.01); *H01L 2224/73265* (2013.01)

(56) References Cited

U.S. PATENT DOCUMENTS

| | | | |
|---|---|---|---|
| 2013/0341800 A1* | 12/2013 | Tu | H01L 21/78 257/774 |
| 2017/0047262 A1* | 2/2017 | Chen | H01L 21/4853 |
| 2017/0338173 A1* | 11/2017 | Chen | H01L 23/49838 |
| 2018/0269181 A1 | 9/2018 | Yang et al. | |
| 2018/0308788 A1 | 10/2018 | Park et al. | |

FOREIGN PATENT DOCUMENTS

| | | |
|---|---|---|
| CN | 110783294 A | 2/2020 |
| CN | 110832636 A | 2/2020 |

\* cited by examiner

S701 — Providing a substrate structure, the substrate structure including a core substrate, a plurality of conductive pads (e.g., solder pads) at a first surface of the core substrate, a plurality of packaging pads at a second surface of the core substrate, a plurality of conductive structures (e.g., solder balls) formed on the plurality of conductive pads, and a first molding compound formed on the first surface of the core substrate and encapsulating the plurality of conductive structures; and packaging a plurality of semiconductor chips onto the substrate structure at the first surface of the core substrate S702 — Removing a portion of the first molding compound to expose each conductive structure (e.g. solder ball)

S703 — Reshaping the plurality of conductive structures (e.g., solder balls) to form a plurality of reshaped conductive structures (e.g., reshaped solder balls), a portion of each reshaped conductive structure protruding from the surface of the first molding compound

FIG. 20

SUBSTRATE STRUCTURE, AND FABRICATION AND PACKAGING METHODS THEREOF

CROSS-REFERENCE TO RELATED APPLICATION

This application is a continuation of International Application No. PCT/CN2021/073708, filed on Jan. 26, 2021, the entire content of which is incorporated herein by reference.

FIELD OF THE DISCLOSURE

The present disclosure generally relates to the field of semiconductor fabrication technology and, more particularly, relates to a substrate structure, and a fabrication method and a packaging method thereof.

BACKGROUND

In current packaging technology, semiconductor chips need to be attached to one side of a substrate structure and electrically connected to contact pads formed on the substrate structure using metal wires. After sealing the semiconductor chips on the substrate structure to form a semiconductor package structure, solder balls may be formed on the side of the substrate structure opposite to the semiconductor chips, such that the semiconductor package structure can be further connected to a print circuit board (PCB) through the solder balls. According to the packaging method, in the direction perpendicular to the substrate structure, the dimension of the solder balls is about 20% of the entire thickness of the packaged semiconductor device. That is, the plurality of solder balls occupies a substantial portion of the semiconductor package structure, which brings challenges to further increase the packaging density.

BRIEF SUMMARY OF THE DISCLOSURE

One aspect of the present disclosure provides a method for fabricating a substrate structure for packaging. The method includes providing a core substrate, a plurality of conductive pads at a first surface of the core substrate, and a metal layer at a second surface of the core substrate opposite to the first surface; forming a conductive structure, for pasting the substrate structure onto an external component, on each of the plurality of conductive pads; forming a molding compound on the first surface of the core substrate and to encapsulate the conductive structure; and forming a plurality of packaging pads by patterning the metal layer at the second surface of the core substrate.

Another aspect of the present disclosure provides a substrate structure for packaging. The substrate structure includes a core substrate, a plurality of conductive pads at a first surface of the core substrate, and a plurality of packaging pads at a second surface of the core substrate opposite to the first surface; a conductive structure on each of the plurality of conductive pads for pasting the substrate structure onto an external component; and a molding compound on the first surface of the core substrate and encapsulating the conductive structure.

Another aspect of the present disclosure provides a packaging method. The method includes providing a substrate structure according to the present disclosure; packaging a plurality of semiconductor chips onto the substrate structure at the second surface of the core substrate; and removing a portion of the first molding compound to expose a portion of the conductive structure at the first surface of the core substrate.

Another aspect of the present disclosure provides a semiconductor structure. The semiconductor structure includes a substrate structure according to the present disclosure; and a plurality of semiconductor chips packaged onto the substrate structure at the second surface of the core substrate.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIG. 20 illustrates a schematic flowchart of an exemplary packaging method according to various embodiments of the present disclosure.

DETAILED DESCRIPTION

Figure 1:
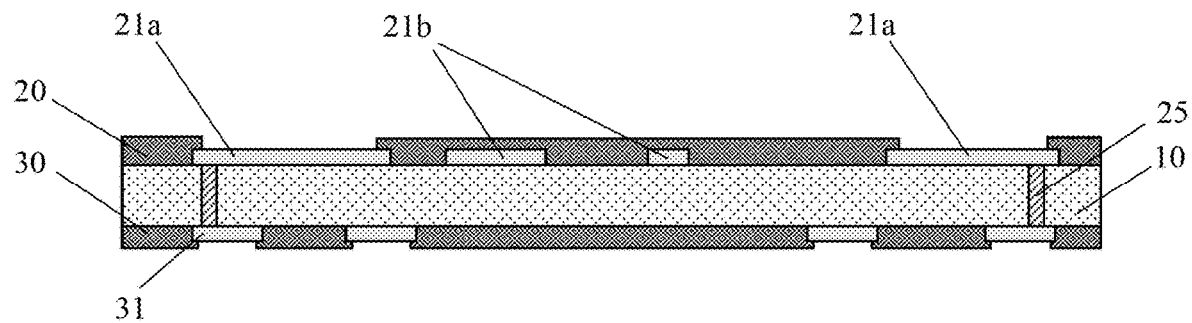
FIG. 1 illustrates a schematic cross-sectional view of a substrate structure for packaging.

Reference will now be made in detail to exemplary embodiments of the invention, which are illustrated in the accompanying drawings. Wherever possible, the same reference numbers will be used throughout the drawings to refer to the same or like parts.

Although specific configurations and arrangements are discussed, it should be understood that this is done for illustrative purposes only. A person skilled in the pertinent art should recognize that other configurations and arrangements can be used without departing from the spirit and scope of the present disclosure. It will be apparent to a person skilled in the pertinent art that the present disclosure can also be employed in a variety of other applications.

It should be noted that references in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a", "an", or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on", "above", and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath", "below", "lower", "above", "upper", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 0.1-15% of the value (e.g., ±2%, ±5%, or ±10% of the value).

As used herein, the term "3D memory device" refers to a semiconductor device with vertically oriented strings of memory cell transistors (referred to herein as "memory strings", such as NAND memory strings) on a laterally-oriented substrate so that the memory strings extend in the vertical direction with respect to the substrate. As used herein, the term "vertical/vertically" means nominally perpendicular to the lateral surface of a substrate.

FIG. 1 illustrates a schematic cross-sectional view of a substrate structure for packaging. Referring to FIG. 1, the substrate structure includes a core substrate 10, including a first surface and a second surface opposite to the first surface. The substrate structure further includes a plurality of packaging pads 21a, a plurality of conductive lines 21b, and a first solder resist (SR) layer 20 disposed on the first surface of the core substrate 10, and a plurality of solder pads 31 and a second SR layer 30 disposed on the second surface of the core substrate 10. The first SR layer 20 covers the first surface of the core substrate 10 and the plurality of conductive lines 21b, and the second SR layer 30 cover the second surface of the core substrate 10. Each packaging pad 21a of the plurality of packaging pads 21a is at least partially exposed by the first SR layer 20. Each solder pad 31 of the plurality of solder pads 31 is at least partially exposed by the second SR layer 30. Therefore, the second SR layer 30 can serve as a solder mask for subsequent formation of solder balls. Further, the substrate structure also includes a plurality of contact plugs 25 disposed through the core substrate 10 and each connecting a packaging pad 21a on the first surface of the core substrate 10 and a solder pad 31 on the second surface of the core substrate 10.

Figure 2:
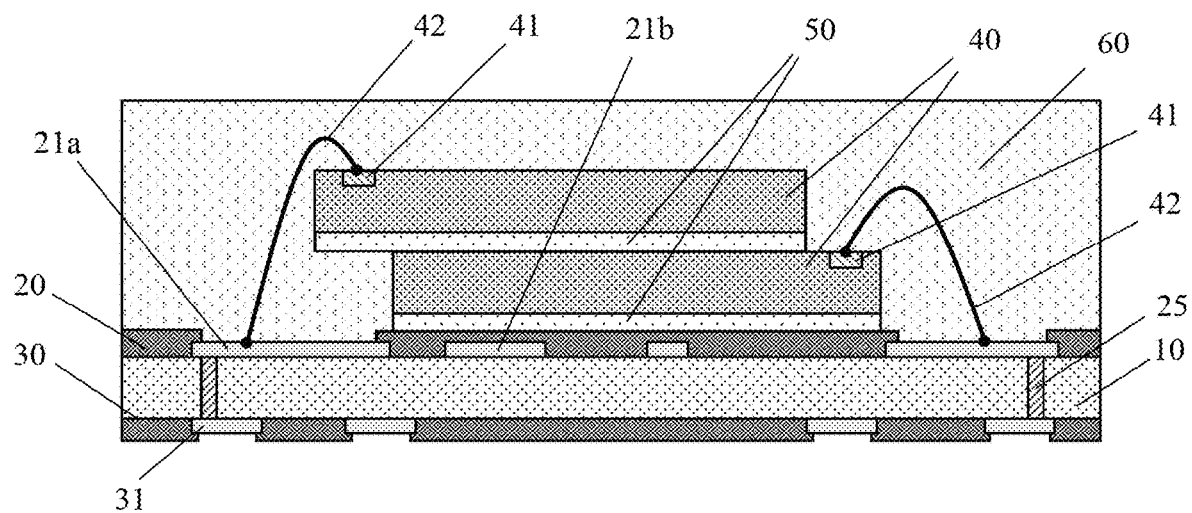
FIGS. 2-3 illustrate schematic cross-sectional views of semiconductor structures at certain stages of a packaging method based on the substrate structure shown in FIG. 1.

FIG. 2 illustrates a schematic view of a semiconductor structure with a plurality of semiconductor chips attached on the substrate structure shown in FIG. 1. Referring to FIG. 2, a plurality of semiconductor chips 40 is then attached to the side of the first SR layer 20 of the substrate structure. Each semiconductor chip 40 is attached to the substrate structure using an adhesive layer 50. For illustrative purposes, shown in FIG. 2, two semiconductor chips 40 are stacked vertically on the substrate structure with a certain displacement to ensure that chip-contact pads 41 disposed on the top surface of each semiconductor chip 40 are exposed for further wire bonding. However, based on actual needs, the number of the semiconductor chips 40 attached on the substrate structure may be different from two, and the semiconductor chips 40 may be vertically stacked on each other and/or laterally spaced apart.

Each chip-contact pad 41 exposed on the top surface of the semiconductor chips 40 are then connected to a corresponding packaging pad 21a using a metal wire 42 by wire bonding. Further, a molding compound 60 is used to seal the semiconductor chips 40 disposed above the first SR layer 20. The molding compound 60 not only provides mechanical protection for the semiconductor structure but also prevents external moisture and dust from accessing the semiconductor chips 40, the packaging pads 21a, and the metal wires 42.

Figure 3:
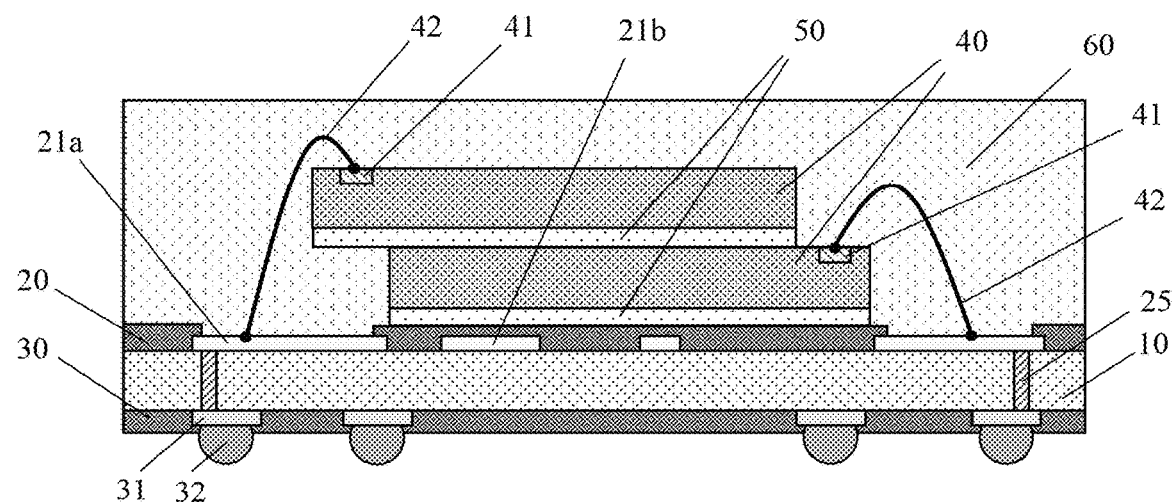

FIG. 3 illustrates a schematic view of a semiconductor structure after a plurality of solder balls is planted on the solder pads of the semiconductor package structure shown in FIG. 2. Referring to FIG. 3, after the semiconductor chips 40 are attached and sealed, a plurality of solder balls 32 is planted on the plurality of solder pads 31 exposed by the second SR layer 30.

Further, the semiconductor package structure may be connected to a printed circuit board (PCB) through the plurality of solder balls. As such, various semiconductor package structures, each including a plurality of semiconductor chips, can be integrated on a single PCB.

According to the substrate structure and the packaging method, the height of the solder balls 32 takes about 20% of the overall thickness of the semiconductor structure, which is adverse to the miniaturization of semiconductor devices. Moreover, the substrate structure usually has a large surface area and a small thickness. Correspondingly, the package area of the semiconductor device is large. Therefore, because coefficient of thermal expansion (CTE) mismatch of the materials is unidirectional, the substrate structure may easily warp during the packaging process, thereby affecting the performance of the semiconductor package structure. Further, after placing the plurality of semiconductor chips 40 on the substrate structure and forming the molding compound 60 to seal the semiconductor structure, the solder mask (e.g., the second SR layer 30) may easily change color during the fabrication process, which may reduce the production yield when further planting solder balls and connecting the semiconductor package structure to the PCB. In addition, after the semiconductor package structure is connected to the PCB, stress applied to the semiconductor package structure from the PCB may be large, and when the structure is subjected to temperature cycling, the stress may be large enough to cause damages to the metal wires 42 and/or the conductive lines 21*b*. For example, the large stress applied to the package semiconductor structure may lead to a broken conductive line 21*b* or a broken metal wire 42.

Figure 13:
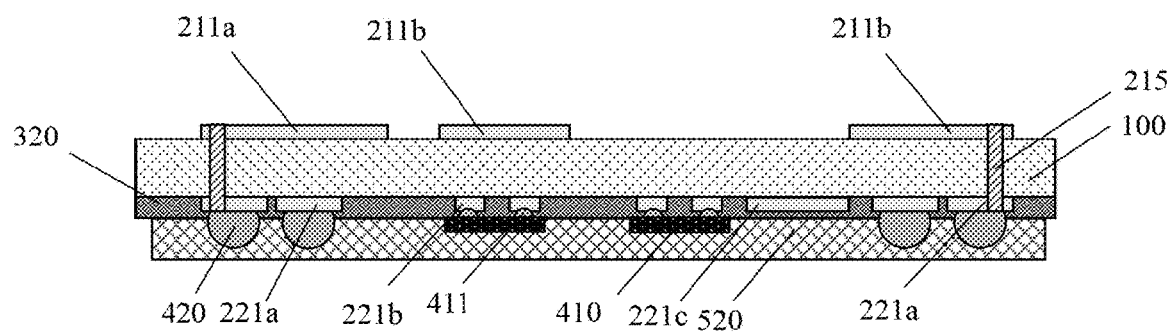
Figure 14:
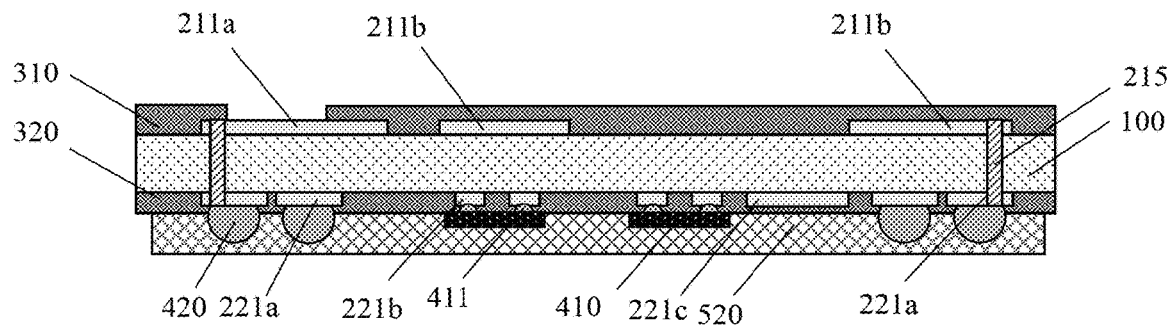
Figure 15:
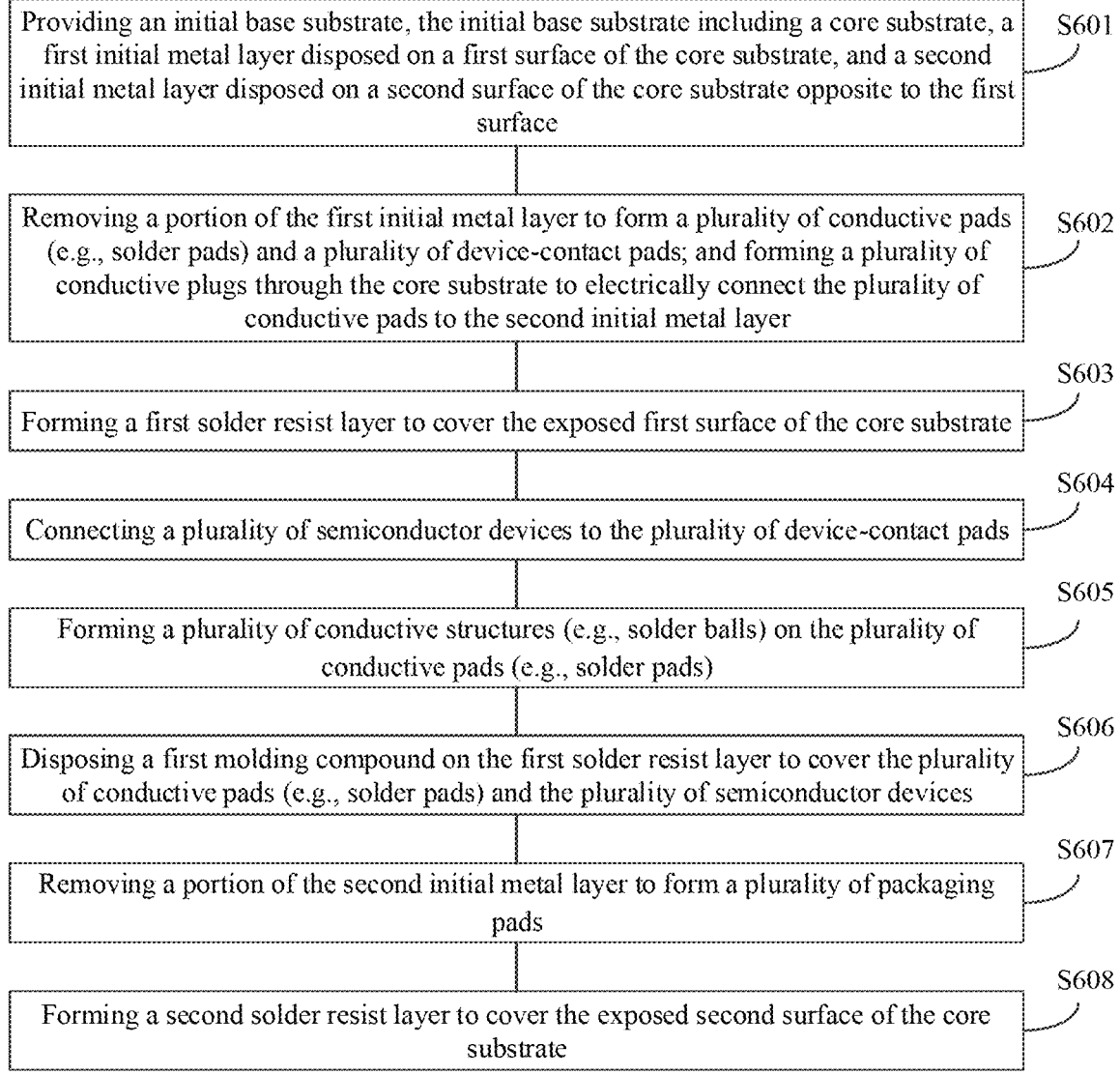
FIG. 15 illustrates a schematic flowchart of an exemplary method for fabricating a substrate structure according to various embodiments of the present disclosure.

The present disclosure provides a method for fabricating a substrate structure. FIG. 15 illustrates a schematic flowchart of an exemplary method for fabricating a substrate structure according to various embodiments of the present disclosure, and FIGS. 4-14 illustrate schematic views of semiconductor structures at certain stages of the fabrication method.

Figure 4:
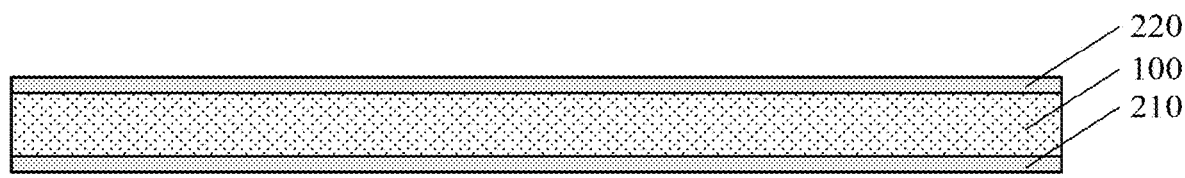
FIGS. 4-14 illustrate schematic views of semiconductor structures at certain stages of an exemplary method for fabricating a substrate structure according to various embodiments of the present disclosure.

Referring to FIG. 15, an initial substrate may be provided, and the initial substrate may include a core substrate, a first initial metal layer, and a second initial metal layer, the core substrate including a first surface and a second surface opposite to the first surface, and the first initial metal layer and the second initial metal layer disposed respectively on the first surface and the second surface of the core substrate (S601). FIG. 4 illustrates a schematic cross-sectional view of a semiconductor structure consistent with various embodiments of the present disclosure.

Referring to FIG. 4, an initial substrate may be provided. The initial substrate may include a core substrate 100, a first initial metal layer 220, and a second initial metal layer 210. The core substrate 100 may include a first surface (not labeled) on which the first initial metal layer 220 is disposed, and a second surface (not labeled) on which the second initial metal layer 210 is disposed. That is, the first initial metal layer 220 and the second initial metal layer 210 may be disposed on the two opposite surfaces of the core substrate 100. The first initial metal layer 220 may be used to form a plurality of solder pads, a plurality of device-contact pads, and a plurality of first conductive lines in a subsequent process, and the second initial metal layer 210 may be used to form a plurality of packaging pads and a plurality of second conductive lines in a subsequent process.

In one embodiment, the core substrate 100 may be made of silicon. In other embodiments, the core substrate 100 may be made of any other appropriate material with low electrical conductivity. In one embodiment, the first initial metal layer 220 and the second initial metal layer 210 may be both made of a same metal. The metal may include copper, aluminum, tungsten, gold, or a combination thereof. For example, the first initial metal layer 220 and the second initial metal layer 210 may be made of copper or aluminum. In other embodiments, the first initial metal layer 220 and the second initial metal layer 210 may be made of different metals. For example, the first initial metal layer 220 may be made of copper, and the second initial metal layer 210 may be made of aluminum.

Figure 5:
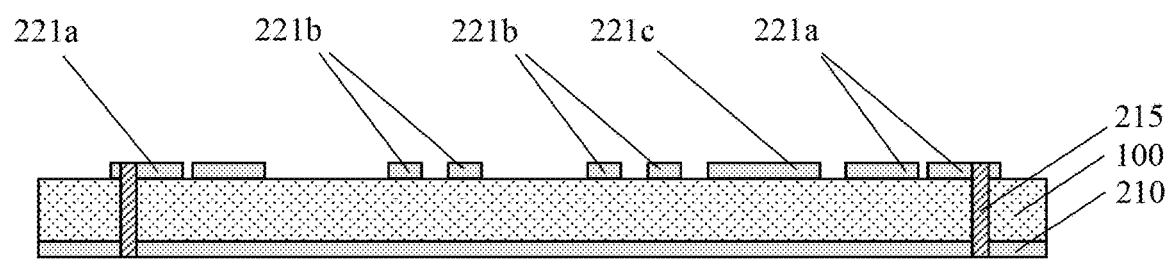

Further, returning to FIG. 15, a portion of the first initial metal layer may be removed to form a plurality of conductive pads (e.g., solder pads) and a plurality of device-contact pads, and a plurality of conductive plugs may be formed through the core substrate to electrically connect the plurality of conductive pads with the second initial metal layer (S602). FIG. 5 illustrates a schematic cross-sectional view of a semiconductor structure consistent with various embodiments of the present disclosure.

Referring to FIG. 5, a portion of the first initial metal layer 220 (referring to FIG. 4) may be removed to form a plurality of solder pads 221*a* and a plurality of device-contact pads 221*b*. In addition, a plurality of conductive plugs 215 may be formed through the core substrate 100 with each conductive plug 215 connecting a corresponding solder pad 221*a* to the second initial metal layer 210.

In one embodiment, after removing the portion of the first initial metal layer 220, a plurality of first conductive lines 221*c* may also be formed together with the plurality of solder pads 221*a* and the plurality of device-contact pads 221*b*. Each first conductive line 221*c* may be electrically connected to a solder pad 221*a* or a device-contact pad 221*b*.

In one embodiment, the process of removing the portion of the first initial metal layer 220 may include the following exemplary steps. First, a first patterned mask layer (not shown) may be formed on the first initial metal layer 220. The first patterned mask layer may define the profile of the plurality of solder pads 221*a* and the plurality of device-contact pads 221*b*. The first initial metal layer 220 may then be etched to expose the core substrate 100 using the first patterned mask layer as an etch mask. As such, the remaining portion of the first initial metal layer 220 may form the plurality of solder pads 221*a* and the plurality of device-contact pads 221*b*. Further, the first patterned mask layer may be removed.

In one embodiment, the plurality of conductive plugs 215 may be made of a metal, such as copper, aluminum, tungsten, gold, or a combination thereof. The process of forming the plurality of conductive plugs 215 may include the following exemplary steps. A second patterned mask layer (not shown) may be formed above the first surface of the core substrate 100. The second patterned mask layer may define the projected position and size of each conductive plug 215 on the core substrate 100. Further, the first initial metal layer 220 and the core substrate 100 may be etched through using the second patterned mask layer as an etch mask. After etching through the first initial metal layer 220 and the core substrate 100, a portion of the second initial metal layer 210 may also be removed. As such, a plurality of through holes may be formed. The plurality of through holes may then be filled by a metal to form the plurality of conductive plugs 215. Further, the second patterned mask layer may be removed. The plurality of conductive plugs 215 may be formed prior to or after forming the plurality of solder pads 221*a* and the plurality of device-contact pads 221*b*.

Figure 6:
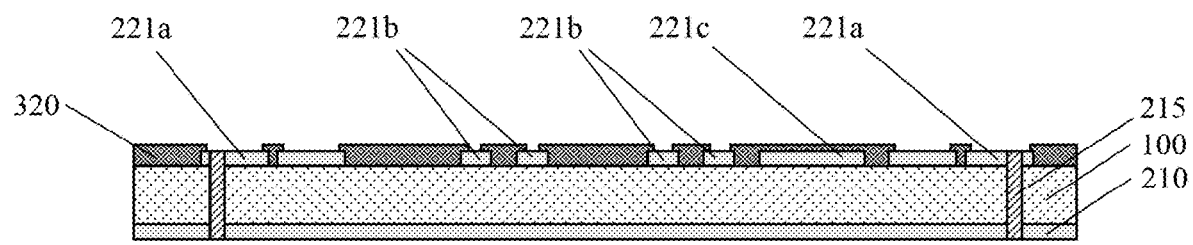

Further, returning to FIG. 15, a first SR layer may be formed to cover the exposed first surface of the core substrate (S603). FIG. 6 illustrates a schematic cross-sectional view of a semiconductor structure consistent with various embodiments of the present disclosure.

Referring to FIG. 6, a first SR layer 320 may be formed to cover the exposed first surface of the core substrate. The first SR layer 320 may also partially cover each solder pad 221a and each device-contact pad 221b. For example, the first SR layer 320 may cover an edge portion of each solder pad 221a and an edge portion of each device-contact pad 221b. In one embodiment, the first SR layer 320 may be made of a polymer.

Figure 7:
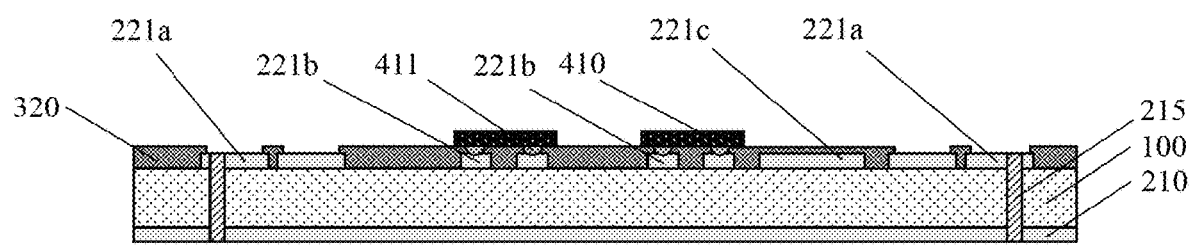

Further, returning to FIG. 15, a plurality of semiconductor devices may be connected to the plurality of device-contact pads (S604). FIG. 7 illustrates a schematic cross-sectional view of a semiconductor structure consistent with various embodiments of the present disclosure.

Referring to FIG. 7, a plurality of semiconductor devices 410 may be connected to the plurality of device-contact pads 221b. In one embodiment, the plurality of semiconductor devices 410 may include passive devices and/or semiconductor dies, and each semiconductor device 410 may be connected to corresponding device-contact pads 221b through a plurality of metal connectors 411. The plurality of metal connectors 411 may include soldering balls, metallic pillars, and any other appropriate connection structures.

Figure 8:
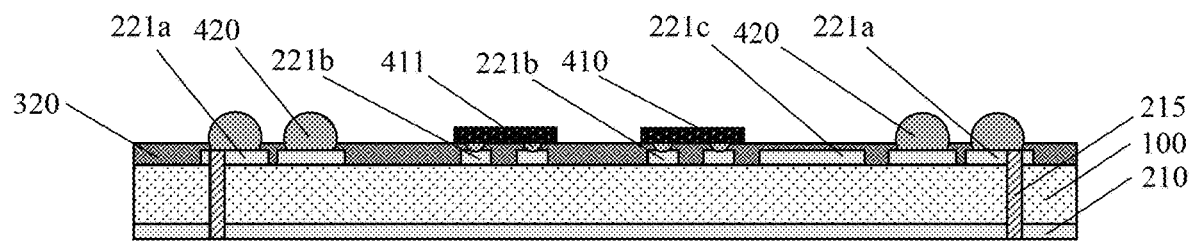

Returning to FIG. 15, a plurality of conductive structures (e.g., solder balls), for pasting the substrate structure onto an external component when the substrate structure is used for packaging, may be formed on the plurality of conductive pads (e.g., solder pads) (S605). FIG. 8 illustrates a schematic cross-sectional view of a semiconductor structure consistent with various embodiments of the present disclosure.

Referring to FIG. 8, a plurality of solder balls 420 may be formed on the plurality of solder pads 221a. As such, each solder pad 221a may be covered by a corresponding solder ball 420. The plurality of solder balls 420 may protrude from the top surface of the first SR layer 320. In addition, along the normal direction of the core substrate 100, a portion of each solder ball 420 may exceed the top surface of the plurality of semiconductor devices 410 with respect to the first surface of the core substrate 100. In one embodiment, in the normal direction of the core substrate 100, the vertical distance from the highest point of each solder ball 420 to the top surface of the plurality of semiconductor devices 410 may be larger than 50 μm, such that when removing a portion of the solder ball 420 in a subsequent process, the plurality of semiconductor devices 410 may not be damaged. In one embodiment, the plurality of solder balls 420 may be used for pasting the substrate structure onto an external component when using the substrate structure for packaging.

Figure 9:
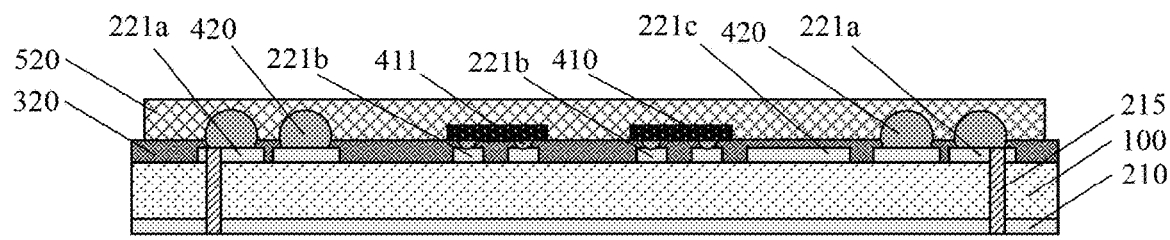

Further, returning to FIG. 15, a first molding compound may be disposed on the first SR layer to cover the plurality of conductive structures (e.g., solder balls) and the plurality of semiconductor devices (S606). FIG. 9 illustrates a schematic cross-sectional view of a semiconductor structure consistent with various embodiments of the present disclosure.

Referring to FIG. 9, a first molding compound 520 may be disposed on the first SR layer 320 to cover the plurality of solder balls 420 and the plurality of semiconductor devices 410. The first molding compound 520 may be made of an epoxy. In the normal direction of the core substrate 100, the distance from the top of the first molding compound 520 to the highest point of each solder ball 420 (e.g., the shortest distance from the top surface of the first molding compound 520 to each solder ball 420) may not be too large or too small. When the distance from the top of the first molding compound 520 to the highest point of a solder ball 420 is too small, the overall thickness of the substrate structure may not be sufficiently increased to prevent warping and/or cracking. However, when the distance from the top of the first molding compound 520 to the highest point of a solder ball 420 is too large, because a portion of each solder ball 420 needs to be removed during the packaging process, the portion of the first molding compound 520 that needs to be removed may also be large, which not only causes material waste, but also unnecessarily increases the production cost. In one embodiment, the shortest distance from the top surface of the first molding compound 520 to each solder ball 420 may be in a range of approximately 50 μm to 500 μm.

Figure 10:
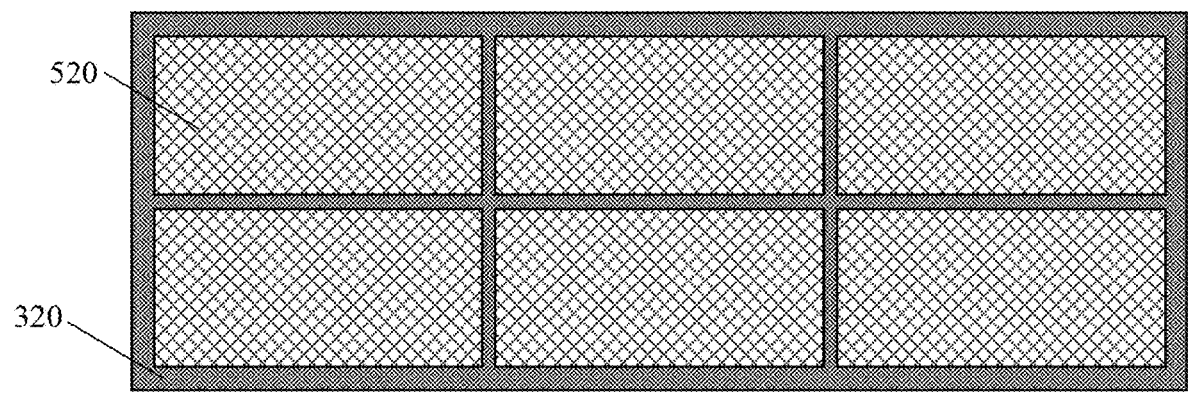
Figure 11:
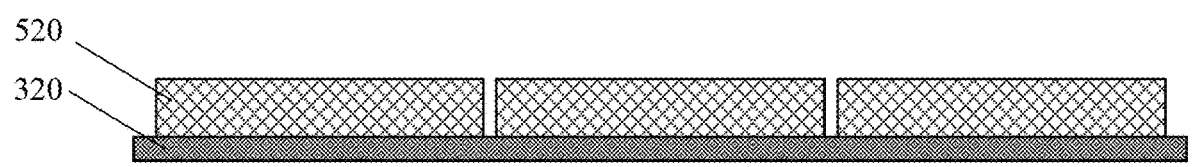
Figure 12:
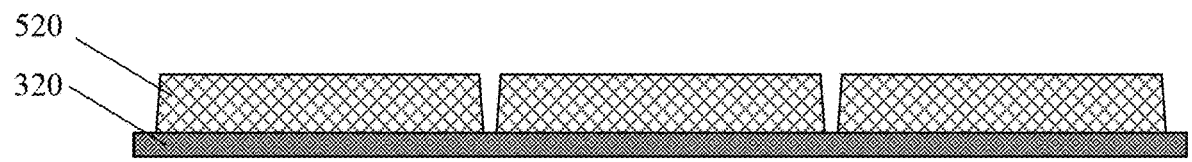

In one embodiment, the first molding compound 520 may include discrete portions. FIG. 10 illustrates a schematic top view of an exemplary first molding compound formed on the first SR layer according to various embodiments of the present disclosure, FIG. 11 illustrates an exemplary side view of the first molding compound shown in FIG. 10, and FIG. 12 illustrates another exemplary side view of the first molding compound shown in FIG. 10. It should be noted that for illustrative purposes, only the first molding compound and the first SR layer are shown in each of FIGS. 10-12.

Referring to FIG. 10, the first molding compound 520 may include a plurality of discrete portions, and adjacent portions of the first molding compound 520 may be spaced apart by a trench 521. In one example, referring to FIG. 11, the trench 521 separating adjacent portion of the first molding compound 520 may have a uniform width. That is, the cross section of the trench 521 may have a rectangular shape. In another example, referring to FIG. 12, the trench 521 separating adjacent portion of the first molding compound 520 may have a trapezoidal shape with the top size larger than the bottom size.

By dividing the first molding compound 520 into discrete portions, lateral stress generated in the substrate structure due to mismatch in the thermal expansion coefficient of different materials may be sufficiently suppressed. In one embodiment, the width of the trench 521 separating adjacent portions of the first molding compound 520 may not be too large or too small. When the width of the trench 521 is too large, stress distribution during a subsequent packaging process may still be undesired in regions between adjacent portions of the first molding compound 520. However, when the width of the trench 521 is too small, fabrication of the trench 521 may be difficult, which increases the production cost. In one embodiment, the width of the trench 521 be in a range of approximately 50 μm to 200 μm. It should be noted that the width of the trench 521 here refers to the shortest distance between adjacent portions of the first molding compound 520. For example, referring to FIG. 12, when the trench 521 has a trapezoidal shape, the width of the trench 521 may refer to the bottom size of the cross section of the trench 521.

In one embodiment, the process of forming the first molding compound 520 with discrete portions may include the following exemplary steps. A first initial molding compound (not shown) may be formed to cover the first SR layer 320, the plurality of solder balls 420 (referring to FIG. 9), and the plurality of semiconductor devices 410 (referring to FIG. 9). A third patterned mask layer (not shown) may be formed on the first initial molding compound. Further, the portion of the first initial molding compound exposed by the third patterned mask layer may be removed to form a plurality of trenches. The third patterned mask layer may then be removed.

In other embodiments, the process of forming the first molding compound 520 with discrete portions may include the following exemplary steps. A fourth patterned mask layer may be formed on the first SR layer 320. The region covered by the fourth patterned mask layer may correspond to the position of the trenches to be formed. Further, a first initial molding compound (not shown) may be formed. The first initial molding compound may cover the first SR layer 320, the plurality of solder balls 420 (referring to FIG. 9), the plurality of semiconductor devices 410 (referring to FIG. 9), and the fourth patterned mask layer. The fourth patterned mask layer may then be removed, such that the remaining portion of the first initial molding compound may form the first molding compound 520.

Further, returning to FIG. 15, a portion of the second initial metal layer may be removed to form a plurality of packaging pads (S607). FIG. 13 illustrates a schematic cross-sectional view of a semiconductor structure consistent with various embodiments of the present disclosure. It should be noted that the view of the semiconductor structure in FIG. 13 is a flipped view of a semiconductor structure developed from that shown in FIG. 9.

Referring to FIG. 13, a portion of the second initial metal layer 210 (referring to FIG. 9) may be removed to form a plurality of packaging pads 211*a*. In one embodiment, when removing the portion of the second initial metal layer 210 to form the plurality of packaging pads 211*a*, a plurality of second conductive lines 211*b* may be simultaneously formed. Each second conductive lines 211*b* may be electrically connected to a packaging pad 211*a*.

Further, each conductive plug 215 formed through the core substrate 100 may connect to a packaging pad 211*a* or a second conductive line 211*b*. It should be noted that in the present disclosure, as an example, the plurality of conductive plugs 215 is formed prior to forming the plurality of solder balls 420. However, the plurality of conductive plugs 215 may be formed after forming the plurality of solder balls 420. That is, the plurality of conductive plugs 215 may be formed when removing the portion of the first initial metal layer to form the plurality of solder pads 221*a*, as described in the present disclosure, or the plurality of conductive plugs 215 may be formed when removing the portion of the second initial metal layer to form the plurality of packaging pads 211*a*.

It should be noted that after the substrate structure is formed and a plurality of semiconductor chips is packaged onto the substrate structure, the plurality of first conductive lines 221*c*, the plurality of device-contact pads 221*b*, and the plurality of solder pads 221*a* formed on the first surface of the core substrate 100, the plurality of packaging pads 211*a* and the plurality of second conductive lines 211*b* formed on the second surface of the core substrate 100, and the plurality of conductive plugs 215 formed through the core substrate 100 may provide electrical connections for the plurality of semiconductor chips and the plurality of semiconductor devices 410. As such, electrical signals can be transmitted between different components (including semiconductor chips packaged on the substrate structure, semiconductor devices 410, etc.) of the semiconductor package structure.

Further, returning to FIG. 15, a second SR layer may be formed to cover the exposed second surface of the core substrate (S608). FIG. 14 illustrates a schematic cross-sectional view of a semiconductor structure consistent with various embodiments of the present disclosure.

Referring to FIG. 14, after removing the portion of the second initial metal layer 210 (referring to FIG. 9) to form the plurality of packaging pads 211*a* and the plurality of second conductive lines 211*b*, a portion of the second surface of the core substrate 100 may be exposed. A second SR layer 310 may be formed to cover the exposed second surface of the core substrate 100. The second SR layer 310 may also cover each second conductive line 211*b* and partially cover each packaging pad 211*a*. As such, a substrate structure for packaging semiconductor chips may be formed. In one embodiment, the second SR layer 310 may be made of a polymer.

It should be noted that in one embodiment, the method is described to have a plurality of solder balls formed on the solder pads, and the solder balls may serve as electrical connectors between a semiconductor package structure and a PCB in a subsequent packaging process. However, according to actual needs, conductive pillars or conductive bumps may be alternative structures for providing electrical connections between the semiconductor package structure and the PCB. Therefore, in the present disclosure, solder balls, conductive pillars, conductive bumps, etc. formed on the substrate structure for providing electrical connections to a PCB may all be referred to as conductive structures, and accordingly, the solder pads may be referred to as conductive pads.

According to the disclosed fabrication method of the substrate structure, a plurality of solder balls is formed in the substrate structure, and a molding compound is disposed to cover the plurality of solder balls. Therefore, the overall thickness of the substrate structure is increased, which not only improves the mechanical strength of the substrate structure, but also ensures desired uniform distribution of stress during the packaging process. Further, the molding compound is designed to include discrete portions, which is conducive to reducing lateral stress due to mismatch in the thermal expansion coefficient of different materials. As such, warpage and/or crack due to uneven distribution of stress may be reduced. The SR layer disposed on the same side of the core substrate as the solder balls is covered by the molding compound, such that during the fabrication and packaging process, the SR layer is protected. Therefore, damages to the SR layer, such as scratches, dents, discolorations, etc. may be avoided. In addition, by forming the plurality of solder balls prior to packaging semiconductor chips, a plurality of semiconductor devices can be pre-installed on the substrate structure on the side of the solder balls, and during the subsequent packaging process, the plurality of semiconductor devices is protected by the molding compound. Therefore, the disclosed method allows devices to be arranged on the side of the substrate structure where the plurality of solder balls is formed, which is conducive to improving the packaging density of the semiconductor structure.

The present disclosure also provides a substrate structure for packaging semiconductor chips. FIG. 14 illustrates a schematic cross-sectional view of an exemplary substrate structure consistent with various embodiments of the present disclosure.

Referring to FIG. 14, the substrate structure may include a core substrate 100. The core substrate 100 may include a first surface (not labeled) and a second surface (not labeled) opposite to the first surface. The substrate structure may also include a plurality of solder pads 221*a* and a plurality of device-contact pads 221*b* disposed on the first surface of the core substrate 100. The plurality of solder pads 221*a* and the plurality of device-contact pads 221*b* may be made of a metal, such as copper, aluminum, tungsten, gold, or a combination thereof. In one embodiment, the substrate structure may also include a plurality of first conductive lines 221c disposed on the first surface of the core substrate 100, and the plurality of first conductive lines 221c may be made of a same metal as the plurality of solder pads 221a and the plurality of device-contact pads 221b.

The substrate structure may further include a plurality of solder balls 420 formed on the plurality of solder pads 221a, and a plurality of semiconductor devices 410 connected to the plurality of device-contact pads 221b. In one embodiment, the plurality of semiconductor devices 410 may include passive devices and/or semiconductor dies, and each semiconductor device 410 may be connected to corresponding device-contact pads 221b through a plurality of metal connectors 411. The plurality of metal connectors 411 may include soldering balls, metallic pillars, and any other appropriate connection structures.

The substrate structure may also include a first SR layer 320 disposed on the first surface of the core substrate 100. The first SR layer 320 may partially cover each solder pad 221a and each device-contact pad 221b. In one embodiment, the first SR layer 320 may be made of a polymer.

The substrate structure may also include a first molding compound 520 disposed on the first surface of the core substrate 100. The first molding compound 520 may cover the first SR layer 320, the plurality of solder balls 420, and the plurality of semiconductor devices 410. In the normal direction of the core substrate 100, the distance from the top of the first molding compound 520 to the highest point of each solder ball 420 (e.g., the shortest distance from the top surface of the first molding compound 520 to each solder ball 420) may not be too large or too small. When the distance from the top of the first molding compound 520 to the highest point of a solder ball 420 is too small, the overall thickness of the substrate structure may not be sufficiently increased to prevent warping and/or cracking. However, when the distance from the top of the first molding compound 520 to the highest point of a solder ball 420 is too large, because a portion of each solder ball 420 needs to be removed during the packaging process, the portion of the first molding compound 520 that needs to be removed may also be large, which not only causes material waste, but also unnecessarily increases the production cost. In one embodiment, the shortest distance from the top surface of the first molding compound 520 to each solder ball 420 may be in a range of approximately 50 μm to 500 μm.

In one embodiment, the first molding compound 520 may include discrete portions. FIG. 10 illustrates a schematic top view of an exemplary first molding compound formed on the first SR layer according to various embodiments of the present disclosure, FIG. 11 illustrates an exemplary side view of the first molding compound shown in FIG. 10, and FIG. 12 illustrates another exemplary side view of the first molding compound shown in FIG. 10. It should be noted that for illustrative purposes, only the first molding compound and the first SR layer are shown in each of FIGS. 10-12.

Referring to FIG. 10, the first molding compound 520 may include a plurality of discrete portions, and adjacent portions of the first molding compound 520 may be spaced apart by a trench 521. In one example, referring to FIG. 11, the trench 521 separating adjacent portion of the first molding compound 520 may have a uniform width. That is, the cross section of the trench 521 may have a rectangular shape. In another example, referring to FIG. 12, the trench 521 separating adjacent portion of the first molding compound 520 may have a trapezoidal shape with the top size larger than the bottom size.

By dividing the first molding compound 520 into discrete portions, lateral stress generated in the substrate structure due to mismatch in the thermal expansion coefficient of different materials may be sufficiently suppressed. In one embodiment, the width of the trench 521 separating adjacent portions of the first molding compound 520 may not be too large or too small. When the width of the trench 521 is too large, stress distribution during a subsequent packaging process may still be undesired in regions between adjacent portions of the first molding compound 520. However, when the width of the trench 521 is too small, fabrication of the trench 521 may be difficult, which increases the production cost. In one embodiment, the width of the trench 521 be in a range of approximately 50 μm to 200 μm. It should be noted that the width of the trench 521 here refers to the shortest distance between adjacent portions of the first molding compound 520. For example, referring to FIG. 12, when the trench 521 has a trapezoidal shape, the width of the trench 521 may refer to the bottom size of the cross section of the trench 521.

Further, the substrate structure may also include a plurality of packaging pads 211a and a plurality of second conductive lines 211b disposed on the second surface of the core substrate 100. In one embodiment, the plurality of packaging pads 211a and the plurality of second conductive lines 211b may be made of a metal, such as copper, aluminum, tungsten, gold, or a combination thereof.

The substrate structure may include a second SR layer 310 disposed on the second surface of the core substrate 100. The second SR layer may cover the plurality of second conductive lines 211b and partially cover each packaging pad 211a. In one embodiment, the second SR layer 310 may be made of a polymer.

The substrate structure may include a plurality of conductive plugs 215 formed through the core substrate 100. In one embodiment, each conductive plug 215 may connect a solder pad 221a on the first surface of the core substrate to a packaging pad 211a or a second conductive line 211b. The plurality of conductive plugs 215 may be made of a metal, such as copper, aluminum, tungsten, gold, or a combination thereof.

It should be noted that in one embodiment, the substrate structure is described to include a plurality of solder balls formed on the solder pads, and the solder balls may serve as electrical connectors between a semiconductor package structure and a PCB in a subsequent packaging process. However, according to actual needs, conductive pillars or conductive bumps may be alternative structures for providing electrical connections to the PCB. Therefore, in the present disclosure, solder balls, conductive pillars, conductive bumps, etc. formed on the substrate structure for providing electrical connections to a PCB may all be referred to as conductive structures, and accordingly, the solder pads may be referred to as conductive pads.

According to the disclosed substrate structure, a plurality of solder balls is formed in the substrate structure, and a molding compound is disposed to cover the plurality of solder balls. Therefore, the overall thickness of the substrate structure is increased, which not only improves the mechanical strength of the substrate structure, but also ensures desired uniform distribution of stress during the packaging process. Further, the molding compound is designed to include discrete portions, which is conducive to reducing lateral stress due to mismatch in the thermal expansion coefficient of different materials. As such, warpage and/or crack due to uneven distribution of stress may be reduced. The SR layer disposed on the same side of the core substrate as the solder balls is covered by the molding compound, such that during the fabrication and packaging process, the SR layer is protected. Therefore, damages to the SR layer, such as scratches, dents, discolorations, etc. may be avoided. In addition, with the plurality of solder balls formed in the substrate structure, a plurality of semiconductor devices can be pre-installed on the substrate structure on the side of the solder balls, and during a packaging process using the substrate structure, the plurality of semiconductor devices is protected by the molding compound. Therefore, the disclosed substrate structure allows devices to be arranged on the side where the plurality of solder balls is formed, which is conducive to improving the packaging density of the semiconductor structure.

Further, the present disclosure also provides a packaging method using a substrate structure according to various embodiments of the present disclosure. FIG. 20 illustrates a schematic flowchart of an exemplary packaging method according to various embodiments of the present disclosure, and FIGS. 16-19 illustrate schematic cross-sectional views of semiconductor structures at certain stages of the packaging method.

Figure 16:
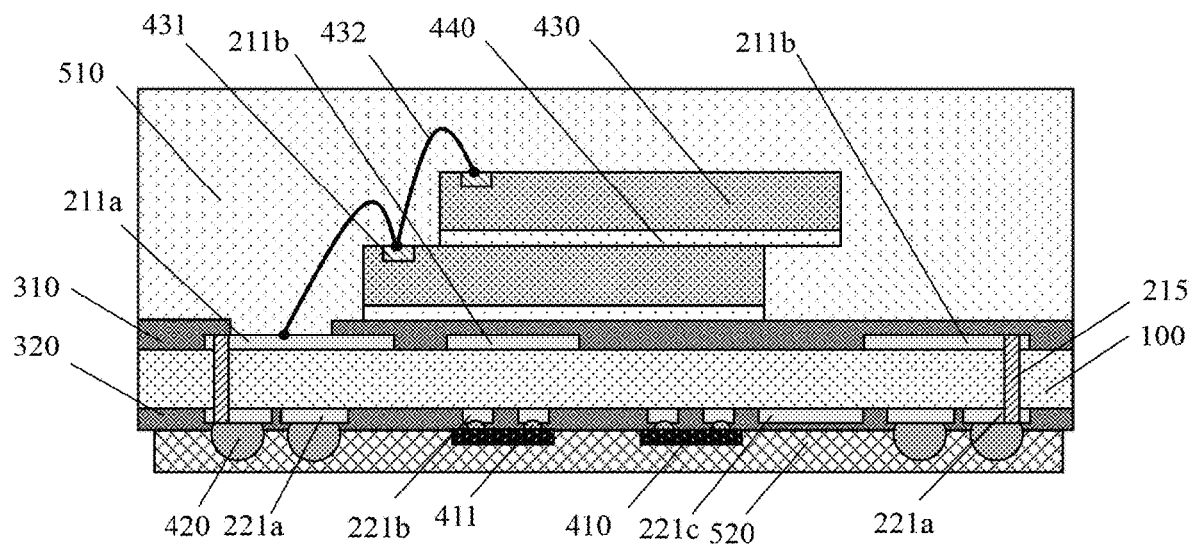
FIGS. 16-19 illustrate schematic cross-sectional views of semiconductor structures at certain stages of an exemplary packaging method according to various embodiments of the present disclosure.

Referring to FIG. 20, a substrate structure may be provided, the substrate structure including a core substrate, a plurality of conductive pads (e.g., solder pads) at a first surface of the core substrate, a plurality of packaging pads at a second surface of the core substrate, a plurality of conductive structures (e.g., solder balls) formed on the plurality of conductive pads, and a first molding compound formed on the first surface of the core substrate and encapsulating the plurality of conductive structures; and a plurality of semiconductor chips may be packaged onto the substrate structure at the first surface of the core substrate (S701). FIG. 16 illustrates a schematic cross-sectional view of a semiconductor structure consistent with various embodiments of the present disclosure.

Referring to FIG. 16, a substrate structure consistent with various embodiments of the present disclosure may be provided. For example, the substrate structure may include a core substrate 100, having a first surface (not labeled) and a second surface (not labeled) opposite to the first surface. The substrate structure may include a plurality of packaging pads 211a and a second SR layer 310 disposed on the second surface of the core substrate 100. Each packaging pad 211a may at least partially exposed by the second SR layer 310. The substrate structure may also include a plurality of solder pads 221a and a first SR layer 320 disposed on the first surface of the core substrate 100. Each solder pad 221a may at least partially exposed by the first SR layer 320. The substrate structure may include a plurality of solder balls 420 formed on the plurality of solder pads 221a, and the plurality of solder balls 420 may protrude from the first SR layer 320. The substrate structure may further include a first molding compound 520 disposed on the first surface of the core substrate 100. The first molding compound 520 may be made of an epoxy, and may cover the plurality of solder balls 420 and may include discrete portions.

Further, a plurality of semiconductor chips 430 may be attached to the substrate structure from the side opposite to the plurality of solder pads. That is, the plurality of semiconductor chips 430 may be attached to the second SR layer 310. Each semiconductor chip 430 may include at least one chip-contact pad 431 and may be attached to the substrate structure or another semiconductor chip 430 using an adhesive layer 440. For illustrative purposes, shown in FIG. 16, two semiconductor chips 430 are stacked vertically on the substrate structure with a certain displacement to ensure that chip-contact pads 431 disposed on the top surface of each semiconductor chip 430 are exposed for further wire bonding. However, based on actual needs, the number of the semiconductor chips 430 attached on the substrate structure may be different from two, and the semiconductor chips 430 may be vertically stacked on each other and/or laterally spaced apart.

Each chip-contact pad 431 exposed on the top surface of the semiconductor chips 430 may then be connected to a corresponding packaging pad 211a using a metal wire 432 by wire bonding. Further, a second molding compound 510 may be disposed to seal the semiconductor chips 430 disposed above the second SR layer 310. The second molding compound 510 may be made of an epoxy. The second molding compound 510 may cover the plurality of semiconductor chips 430, the metal wires 432, and the surfaces of the plurality of packaging pads 211a. The second molding compound 510 may not only provide mechanical protection for the semiconductor structure but also prevent external moisture and dust from accessing the semiconductor chips 430, the packaging pads 211a, and the metal wires 432.

Figure 17:
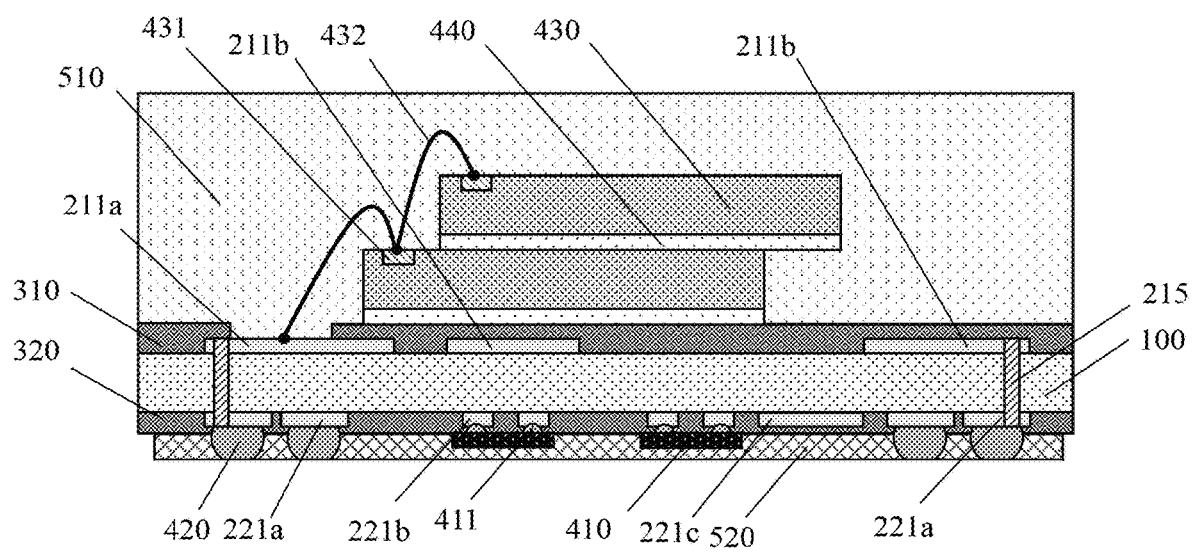

Further, returning to FIG. 20, a portion of the first molding compound may be removed to expose each conductive structure (e.g., solder ball) (S702). FIG. 17 illustrates a schematic cross-sectional view of a semiconductor structure consistent with various embodiments of the present disclosure.

Referring to FIG. 17, a portion of the first molding compound 520 may be removed to expose each solder ball 420. In one embodiment, when removing the portion of the first molding compound 520, a portion of each solder ball 420 may also be removed. Removing the portion of the first molding compound 520 to expose each solder ball 420 may include a chemical mechanical polishing (CMP) process or an etching process. For example, a CMP process may be performed on the surface of the first molding compound 520 away from the core substrate 100 to remove a portion of the first molding compound 520 and a portion of each solder ball 420. After performing the CMP process, each solder ball 420 may be exposed. In another example, the portion of the first molding compound 520 may be removed by a dry etching process, a wet etching process, or a process combining dry etching and wet etching. In one embodiment, after each solder ball 420 is exposed by removing the portion of the first molding compound 520, the surface of the solder ball 420 may be leveled with the surface of the first molding compound 520. That is, the solder ball 420 may have a flat surface on the side away from the core substrate 100.

Figure 18:
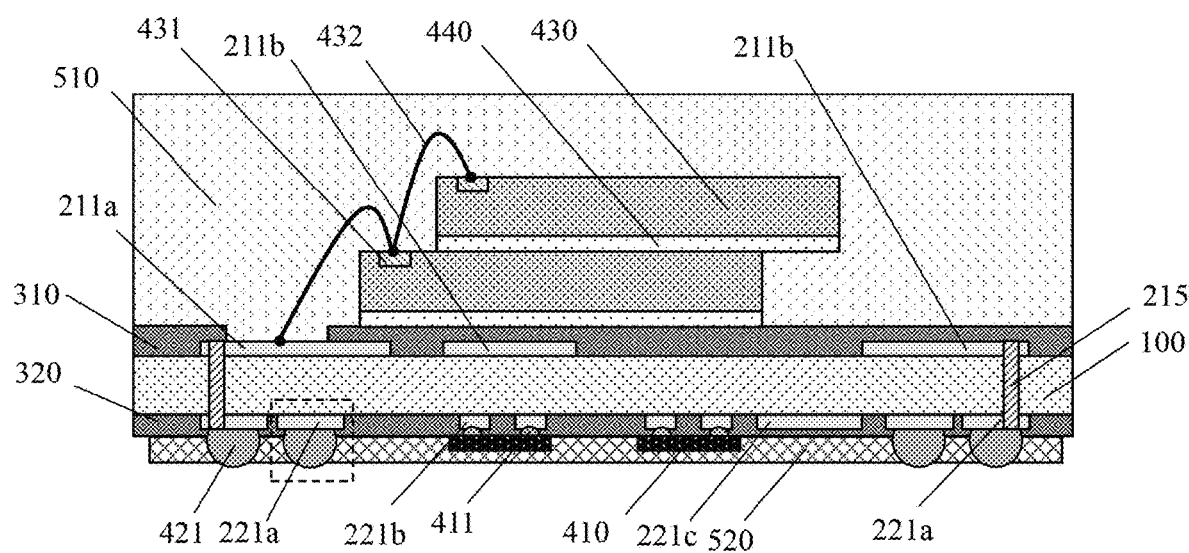

Further, returning to FIG. 20, the plurality of conductive structures (e.g., solder balls) may be reshaped to form a plurality of reshaped conductive structures (reshaped solder balls), and a portion of each reshaped conductive structure may protrude from the surface of the first molding compound (S703). FIG. 18 illustrates a schematic cross-sectional view of a semiconductor structure consistent with various embodiments of the present disclosure, and FIG. 19 illustrates a schematic enlarged view of the semiconductor structure in a dashed frame shown in FIG. 18.

Figure 19:
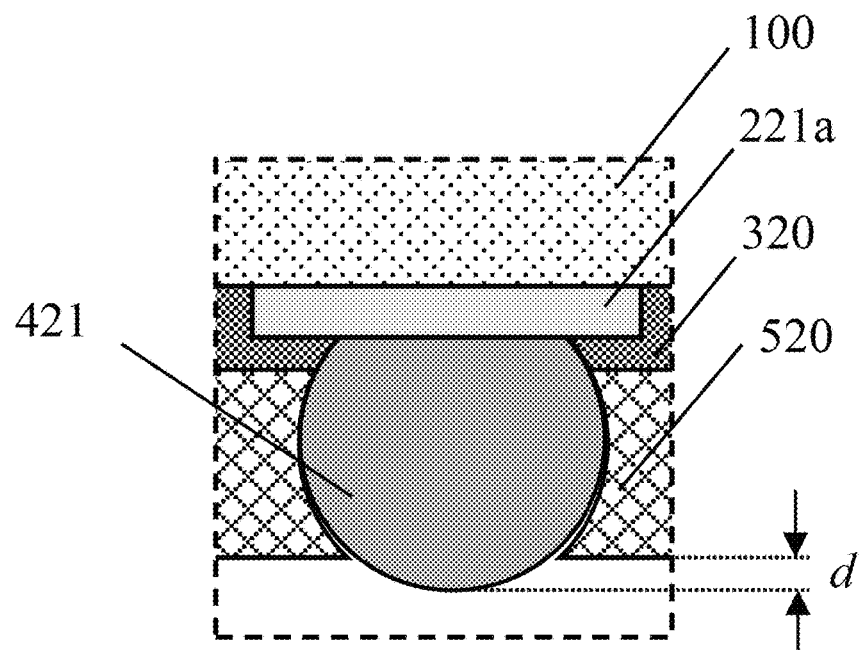

Referring to FIGS. 18-19, the plurality of solder balls 420 (referring to FIG. 17) may be reshaped to form a plurality of reshaped solder balls 421. After the plurality of reshaped solder balls 421 is formed, the plurality of reshaped solder balls 421 may protrude from the surface of the first molding compound 520 away from the core substrate 100. In one embodiment, the plurality of solder balls may be reshaped through a solder reflow process. In one embodiment, in the normal direction of the core substrate, a height d of each reshaped solder ball 421 protruding from the first molding compound may be in a range of approximately 10 µm to 100 µm.

It should be noted that in one embodiment, the substrate structure used for packaging is described to have a plurality of solder balls formed on the solder pads, and when further connecting a semiconductor package structure (referring to FIG. 16) to a PCB, the solder balls may be reshaped and may then serve as electrical connectors between the semiconductor package structure and the PCB. However, according to actual needs, conductive pillars or conductive bumps may be alternative structures for providing electrical connections when the semiconductor package structure is further connected to the PCB. Therefore, in the present disclosure, solder balls, conductive pillars, conductive bumps, etc. formed on the substrate structure for providing electrical connections to a PCB may all be referred to as conductive structures, and accordingly, the solder pads may be referred to as conductive pads. When the substrate structure includes conductive pillars and/or conductive bumps formed on corresponding conductive pads, during the packaging process, each conductive pillar or conductive bump may be reshaped to have a portion protruding from the surface of the first molding compound. For example, when the material used for forming the conductive pillar or conductive bump has a low melting point (e.g., a solder material), a solder reflow process may be performed to reshape the conductive pillar or conductive bump, such that the reshaped conductive pillar or conductive bump may have a portion protruding from the first molding compound. In another example, when the material used for forming the conductive pillar or conductive bump has a high melting point (e.g., copper or aluminum), a metal layer may be formed on the exposed surface of the conductive pillar or conductive bump, and the metal layer may serve as a protruding portion to further connected to a PCB.

Further, in one embodiment, with the plurality of reshaped solder balls 421 protruding from the first molding compound 520, the semiconductor package structure may be connected to a PCB.

According to the disclosed packaging method, a substrate structure consistent with various embodiments of the present disclosure is adopted. The substrate structure includes a plurality of solder balls formed on the plurality of solder pads, and a molding compound covering the plurality of solder balls. Therefore, the overall thickness of the substrate structure is increased, which not only improves the mechanical strength of the substrate structure, but also ensures desired uniform distribution of stress during the packaging process. Further, the molding compound is designed to include discrete portions, which is conducive to reducing lateral stress due to mismatch in the thermal expansion coefficient of different materials. As such, warpage and/or crack due to uneven distribution of stress may be reduced. The SR layer disposed on the same side of the core substrate as the solder balls is covered by the molding compound, such that during the fabrication and packaging process, the SR layer is protected. Therefore, damages to the SR layer, such as scratches, dents, discolorations, etc. may be avoided. In addition, with the plurality of solder balls formed in the substrate structure, a plurality of semiconductor devices can be pre-installed on the substrate structure on the side of the solder balls, and during a packaging process using the substrate structure, the plurality of semiconductor devices is protected by the molding compound. Therefore, packaging semiconductor structures on the substrate structure allows devices to be arranged on the side where the plurality of solder balls is formed, which is conducive to improving the packaging density of the semiconductor structure.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for forming a substrate structure for packaging, comprising:
    providing a core substrate, a plurality of conductive pads at a first surface of the core substrate, and a metal layer at a second surface of the core substrate opposite to the first surface;
    forming a conductive structure, for pasting the substrate structure onto an external component, on each of the plurality of conductive pads;
    prior to forming a molding compound, attaching a semiconductor device to the first surface of the core substrate, wherein, in a direction perpendicular to and away from the first surface of the core substrate, a portion of the conductive structure exceeds a top surface of the semiconductor device;
    forming the molding compound on the first surface of the core substrate to embed the semiconductor device within the molding compound and to encapsulate the conductive structure;
    forming a plurality of packaging pads by patterning the metal layer at the second surface of the core substrate; and
    after forming the plurality of packaging pads, removing a portion of each conductive structure at the first surface with the semiconductor device embedded within the encapsulation layer.

2. The method according to claim 1, wherein prior to forming the molding compound, attaching the semiconductor device to the first surface of the core substrate comprises:
    providing a plurality of device-contact pads at the first surface of the core substrate; and
    attaching the semiconductor device to at least one device-contact pad of the plurality of device-contact pads.

3. The method according to claim 2, further including:
    forming a first solder resist (SR) layer on the first surface of the core substrate, wherein the plurality of conductive pads is at least partially uncovered by the first SR layer, and the plurality of device-contact pads is at least partially uncovered by the first SR layer, wherein
        the conductive structure on each conductive pad includes a portion protruding from a top surface of the first SR layer, and
        the first SR layer, the plurality of conductive pads, and the plurality of device-contact pads are coplanar at the first surface.

4. The method according to claim 3, wherein:
    prior to forming the molding compound, providing a plurality of first conductive lines at the first surface of the core substrate, wherein each first conductive line is covered by the first SR layer and electrically connected to a conductive pad or a device-contact pad for signal exchange.

5. The method according to claim 1, further including:
forming a second solder resist (SR) layer on the second surface of the core substrate, wherein each packaging pad is at least partially uncovered by the second SR layer; and
when patterning the metal layer, forming a plurality of second conductive lines at the second surface of the core substrate, wherein each second conductive line is covered by the second SR layer and electrically connected to a packaging pad for signal exchange.

6. The method according to claim 1, further including:
forming a plurality of conductive plugs through the core substrate, wherein each conductive plug connects a conductive pad of the plurality of conductive pads with a corresponding packaging pad.

7. A method for forming a substrate structure for packaging, comprising:
providing a core substrate, a plurality of conductive pads at a first surface of the core substrate, and a metal layer at a second surface of the core substrate opposite to the first surface;
forming a conductive structure, for pasting the substrate structure onto an external component, on each of the plurality of conductive pads;
prior to forming a molding compound, attaching a semiconductor device to the first surface of the core substrate;
forming the molding compound on the first surface of the core substrate to embed the semiconductor device within the molding compound and to encapsulate the conductive structure; and
forming a plurality of packaging pads by patterning the metal layer at the second surface of the core substrate, wherein:
the molding compound includes a plurality of molding compound portions, and adjacent molding compound portions are separated apart by a trench and are together on the first surface of the core substrate.

8. A substrate structure for packaging, comprising:
a core substrate, a plurality of conductive pads at a first surface of the core substrate, and a plurality of packaging pads at a second surface of the core substrate opposite to the first surface;
a conductive structure, for pasting the substrate structure onto an external component, on each of the plurality of conductive pads;
a semiconductor device attached to the first surface of the core substrate; and
a molding compound on the first surface of the core substrate and encapsulating the conductive structure, wherein the semiconductor device is embedded within the molding compound;
a plurality of device-contact pads at the first surface of the core substrate;
a first solder resist (SR) layer formed on the first surface of the core substrate, wherein the plurality of conductive pads is at least partially uncovered by the first SR layer, and the plurality of device-contact pad is at least partially uncovered by the first SR layer,
wherein the semiconductor device is connected to at least one device-contact pad of the plurality of device-contact pads.

9. The substrate structure according to claim 8, wherein:
in a direction perpendicular to and away from the first surface of the core substrate, a portion of the conductive structure exceeds a top surface of the semiconductor device by a thickness, and the thickness is larger than 50 μm.

10. The substrate structure according to claim 8, further including:
a plurality of first conductive lines formed at the first surface of the core substrate, wherein each first conductive line is covered by the first SR layer and electrically connected to a conductive pad or a device-contact pad for signal exchange.

11. The substrate structure according to claim 8, further including:
a second solder resist (SR) layer, formed on the second surface of the core substrate, wherein each packaging pad of the plurality of packaging pads is at least partially uncovered by the second SR layer;
a plurality of second conductive lines formed at the second surface of the core substrate, wherein each second conductive line is covered by the second SR layer and electrically connected to a packaging pad for signal exchange; and
a plurality of conductive plugs formed through the core substrate, wherein each conductive plug connects a conductive pad of the plurality of conductive pads with a corresponding packaging pad.

12. The substrate structure according to claim 8, wherein:
the molding compound is made of an epoxy.

13. A packaging method, comprising:
providing the substrate structure according to claim 8;
packaging a plurality of semiconductor chips onto the substrate structure at the second surface of the core substrate; and
after the packaging at the second surface of the core substrate, removing a portion of the molding compound to expose a portion of the conductive structure at the first surface of the core substrate.

14. The packaging method according to claim 13, further including:
reshaping the conductive structure to form a reshaped conductive structure, wherein a portion of the reshaped conductive structure protrudes from the molding compound, wherein the reshaped conductive structure is used for pasting the substrate structure onto an external component.

15. The packaging method according to claim 14, wherein:
removing the portion of the molding compound includes a chemical mechanical polishing process or an etching process;
in a direction perpendicular to the first surface of the core substrate, a dimension of a portion of the reshaped conductive structure protruding from the molding compound is in a range of approximately 10 μm to 100 μm;
the conductive structure formed on each of the plurality of conductive pads is a solder ball; and
reshaping the conductive structure to form the reshaped conductive structure includes a solder reflow process.

16. The packaging method according to claim 13, wherein packaging the plurality of semiconductor chips onto the substrate structure at the second surface of the core substrate includes:
attaching the plurality of semiconductor chips at the second surface of the core substrate;
connecting chip-contact pads of the plurality of semiconductor chips to the plurality of packaging pads using metal wires; and forming another molding compound on the second surface of the core substrate to embed the plurality of semiconductor chips, the metal wires, and the plurality of packaging pads.

17. A semiconductor structure, comprising:
the substrate structure according to claim 8; and
a plurality of semiconductor chips packaged onto the substrate structure at the second surface of the core substrate.

18. The semiconductor structure according to claim 17, wherein:
the conductive structure protrudes from a surface of the molding compound, wherein the conductive structure is used for pasting the substrate structure onto an external component;
in a direction perpendicular to the first surface of the core substrate, a dimension of a portion of the conductive structure protruding from the surface of the molding compound is in a range of approximately 10 µm to 100 µm; and
the plurality of semiconductor chips includes at least two NAND dies.

\* \* \* \* \*